(12) United States Patent
Shi et al.

(10) Patent No.: US 11,871,648 B2
(45) Date of Patent: Jan. 9, 2024

(54) ORGANIC PHOTOMULTIPLICATION PHOTODETECTOR WITH BI-DIRECTIONAL BIAS RESPONSE AND METHOD FOR PRODUCING SAME

(71) Applicant: Taiyuan University of Technology, Taiyuan (CN)

(72) Inventors: Linlin Shi, Taiyuan (CN); Yanxia Cui, Taiyuan (CN); Guohui Li, Taiyuan (CN); Ye Zhang, Taiyuan (CN); Wenyan Wang, Taiyuan (CN); Ting Ji, Taiyuan (CN)

(73) Assignee: Taiyuan University of Technology, Taiyuan (CN)

( * ) Notice: Subject to any disclaimer, the term of this patent is extended or adjusted under 35 U.S.C. 154(b) by 129 days.

(21) Appl. No.: 17/542,999

(22) Filed: Dec. 6, 2021

(65) Prior Publication Data

US 2022/0093866 A1 Mar. 24, 2022

(30) Foreign Application Priority Data

Mar. 19, 2021 (CN) .......................... 202110293648.2

(51) Int. Cl.
| | | |
|---|---|---|
| *H10K 71/12* | (2023.01) | |
| *H10K 85/10* | (2023.01) | |
| *H10K 30/81* | (2023.01) | |
| *H10K 102/10* | (2023.01) | |

(52) U.S. Cl.
CPC ......... *H10K 85/1135* (2023.02); *H10K 30/81* (2023.02); *H10K 71/12* (2023.02); *H10K 2102/103* (2023.02)

(58) Field of Classification Search
CPC ..................................................... H10K 71/12
See application file for complete search history.

(56) References Cited

U.S. PATENT DOCUMENTS

| | | | |
|---|---|---|---|
| 8,482,092 B2 | 7/2013 | Lee et al. | |
| 2015/0122314 A1* | 5/2015 | Snaith ..................... | H10K 85/00 136/255 |
| 2021/0305524 A1* | 9/2021 | Saito ....................... | H10K 30/10 |
| 2022/0310929 A1* | 9/2022 | Snaith .................... | C07C 251/00 |

FOREIGN PATENT DOCUMENTS

| | | |
|---|---|---|
| CN | 106098806 A | 11/2016 |
| CN | 111129311 A | 5/2020 |

\* cited by examiner

*Primary Examiner* — Jae Lee

(57) ABSTRACT

This application relates to preparation of organic photomultiplication photodetectors, and more particularly to an organic photomultiplication photodetector with bi-directional bias response and a method for producing the same. The photodetector includes an anode layer, an anode modification layer, an interfacial modification layer, an active layer and a cathode layer arranged in sequence. The interfacial modification layer is made of $Al_2O_3$. The anode layer is made of indium tin oxide (ITO). The anode modification layer is made of poly(3,4-ethylenedioxythiophene):poly(styrenesulfonate)(PEDOT:PSS). The active layer is made of poly(3-hexylthiophene-2,5-diyl):[6,6]-phenyl-$C_{70}$-butyric acid methyl ester (P3HT:$PC_{70}BM$). The cathode layer is made of aluminum, silver or gold.

5 Claims, 3 Drawing Sheets

ORGANIC PHOTOMULTIPLICATION PHOTODETECTOR WITH BI-DIRECTIONAL BIAS RESPONSE AND METHOD FOR PRODUCING SAME

CROSS-REFERENCE TO RELATED APPLICATIONS

This application claims the benefit of priority from Chinese Patent Application No. 202110293648.2, filed on Mar. 19, 2021. The content of the aforementioned application, including any intervening amendments thereto, is incorporated herein by reference in its entirety.

TECHNICAL FIELD

The application relates to preparation of organic photomultiplication photodetectors, and more particularly to an organic photomultiplication photodetector with bi-directional bias response and a method for producing the same.

BACKGGROUND

Trap-assisted carrier tunneling-based organic photomultiplication photodetectors have attracted considerable attention due to their advantages of light weight, simple preparation, high flexibility, good eco-friendliness, low cost, wide source and excellent sensitivity. In the previous researches on organic photomultiplication photodetectors, poly(3,4-ethylenedioxythiophene): poly(styrenesulfonate) (PEDOT:PSS) has been widely applied as the anode modification layer for its excellent hole transport characteristic. However, the organic photomultiplication photodetector incorporating the PEDOT:PSS-based anode modification layer can only work under the unidirectional bias, and fails to generate response under the bi-directional bias, which limits its applications in some specific scenarios to a certain extent. As a consequence, it is vital to explore and develop an organic photomultiplication photodetector with bi-directional bias response at present. Extensive researches have indicated that replacing the PEDOT:PSS anode modification layer with a polyfluorene anode modification layer, or introducing an interfacial modification layer with a thickness of tens of nanometers between the PEDOT:PSS anode modification layer and the active layer is capable of achieving the bi-directional bias response, but will also lead to the attenuation of external quantum efficiency (EQE) and responsivity (R) of the device.

In order to obtain an organic photomultiplication photodetector with bi-directional bias response and desirable performances, an ultra-thin $Al_2O_3$ interfacial modification layer with a thickness of 0.8±0.02 nm is introduced between the PEDOT:PSS anode modification layer and the active layer, and by means of the electron traps assisted hole tunneling effect of the active layer, the device can not only generate bi-directional bias response, but also maintain high external quantum efficiency (EQE) and responsivity (R), obtaining an ultra-thin $Al_2O_3$ interfacial modification layer-based high-performance organic photomultiplication photodetector with bi-directional bias response.

SUMMARY

In view of the defects in the prior art, an object of this application is to provide an organic photomultiplication photodetector with bi-directional bias response with high external quantum efficiency (EQE) and responsivity (R) and a method for producing the same.

Technical solutions of the present application are described as follows.

In a first aspect, this application provides an organic photomultiplication photodetector with bi-directional bias response, comprising:
   an anode layer;
   an anode modification layer;
   an interfacial modification layer;
   an active layer; and
   a cathode layer;
   wherein the interfacial modification layer is made of aluminum oxide ($Al_2O_3$).

In an embodiment, the anode layer is made of indium tin oxide (ITO); the anode modification layer is made of poly (3,4-ethylenedioxythiophene): poly(styrenesulfonate) (PEDOT:PSS); the active layer is made of poly(3-hexylthiophene-2,5-diyl):[6,6]-phenyl-$C_{70}$-butyric acid methyl ester (P3HT:$PC_{70}$BM); and the cathode layer is made of aluminum, silver or gold.

In an embodiment, a thickness of the anode modification layer is 25±0.2 nm; a thickness of the active layer is 270±0.2 nm; a thickness of the cathode layer is 100±20 nm; and a thickness of the interfacial modification layer is 0.8±0.02 nm.

In a second aspect, this application also provides a method for preparing a bi-directional bias response-based organic photomultiplication photodetector, comprising:
   (S1) preparing a solution of the active layer;
   (S2) cleaning an ITO glass substrate followed by processing with a plasma cleaner to be used as the anode layer; and applying a PEDOT:PSS layer on the anode layer by spin-coating as the anode modification layer;
   (S3) depositing $Al_2O_3$ on the anode modification layer by atomic layer deposition to obtain an $Al_2O_3$ film as the interfacial modification layer;
   (S4) applying a P3HT:$PC_{70}$BM layer on the interfacial modification layer by spin-coating as the active layer; and
   (S5) depositing a layer of aluminum, silver or gold on the active layer by thermal evaporation as the cathode layer.

In an embodiment, in step (S1), the solution of the active layer is prepared through steps of:
   respectively dissolving 40 mg of poly(3-hexylthiophene-2,5-diyl) (P3HT) and 40 mg of [6,6]-phenyl-$C_{70}$-butyric acid methyl ester ($PC_{70}$BM) in 1 mL of 1,2-dichlorobenzene (o-DCB) followed by stirring at 60° C. to produce a P3HT solution and a $PC_{70}$BM solution; and mixing 0.01 mL of the $PC_{70}$BM solution with 1 mL of the P3HT solution followed by stirring at 60° C. to obtain the solution of the active layer; wherein a weight ratio of P3HT to $PC_{70}$BM is 100:1.

In an embodiment, in step (S2), after the PEDOT:PSS layer is spin-coated on the ITO glass substrate, the ITO glass substrate coated with the PEDOT:PSS layer is placed on a heating table, annealed at 120° C. for 15 minutes, and subjected to standing at room temperature for at least 5 minutes before proceeding to the step (S3).

In an embodiment, in step (S3), the interfacial modification layer is prepared through steps of:
   reacting trimethylaluminum with water vapor at 150° C. to produce $Al_2O_3$; and depositing the $Al_2O_3$ on the anode modification layer followed by vacuum standing for at least 5 minutes;

wherein the $Al_2O_3$ is deposited at a rate of 0.1 nm/one cycle, and the number of cycles is controlled to determine a thickness of the $Al_2O_3$ film.

In an embodiment, the step of "applying a P3HT:$PC_{70}$BM layer on the interfacial modification layer by spin-coating as the active layer" comprises:

applying the solution of the active layer on the interfacial modification layer by spin-coating at a rotation speed of 1200 rpm followed by annealing at 80° C. for 20 seconds and standing in a glove box for at least 3 minutes.

Compared with the prior art, this application has the following beneficial effects.

In the organic photomultiplication photodetector provided herein, an ultra-thin $Al_2O_3$ interfacial modification layer is introduced between the anode modification layer and the active layer, such that the organic photomultiplication photodetector can not only generate response under bi-directional bias, but also has high external quantum efficiency (EQE) and responsivity (R). It has been experimentally confirmed that the organic photomultiplication photodetector exhibits an external quantum efficiency of $1.75 \times 10^4$% and a responsivity of 46.44 A/W under a bias of −19 V and a wavelength of 330 nm, and an external quantum efficiency of $1.57 \times 10^6$% and a responsivity of 4169.49 A/W under a bias of 19 V and a wavelength of 330 nm. It can be concluded that the organic photomultiplication photodetector provided herein achieves the bi-directional bias response, and shows higher external quantum efficiency (EQE) and responsivity (R) under the forward bias compared to the reverse bias.

DETAILED DESCRIPTION OF EMBODIMENTS

This application will be described in detail below with reference to embodiments and accompanying drawings to make the objectives, technical solutions, and advantages of this application clearer. Obviously, provided below are merely some embodiments of this application, which are not intended to limit the application. Other embodiments obtained by those of the ordinary skill in the art based on the embodiments provided herein without paying any creative effort shall fall within the scope of the present application.

Embodiment 1

Figure 1:
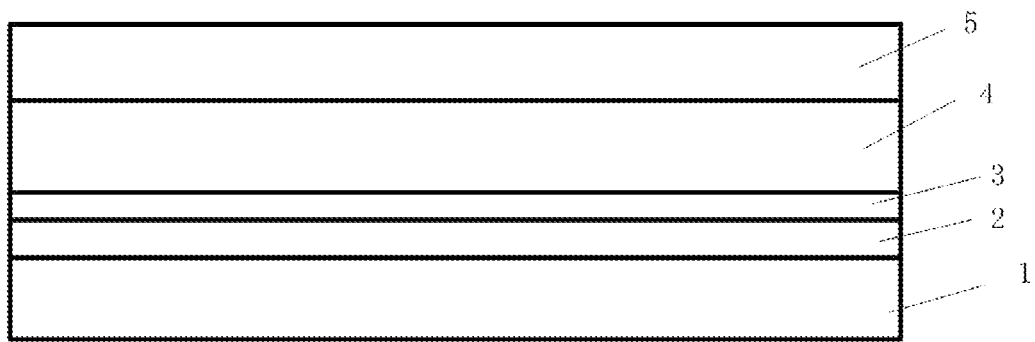
FIG. 1 schematically shows a structure of an organic photomultiplication photodetector according to an embodiment of this application; where 1: anode layer; 2: anode modification layer; 3: interfacial modification layer; 4: active layer; and 5: cathode layer.

As shown in FIG. 1, an organic photomultiplication photodetector with bi-directional bias response is provided, which includes an anode layer 1, an anode modification layer 2, an interfacial modification layer 3, an active layer 4, and a cathode layer 5, where the anode layer 1 is an indium tin oxide (ITO) layer; the anode modification layer 2 is a PEDOT:PSS layer with a thickness of 25±0.2 nm; the interfacial modification layer 3 is an aluminum oxide ($Al_2O_3$) layer with a thickness of 0.8±0.02 nm; the active layer 4 is a P3HT:$PC_{70}$BM layer with a thickness of 270±0.2 nm; and the cathode layer 5 is a layer of aluminum, silver or gold with a thickness of 100±20 nm.

Embodiment 2

Provided herein is a method for producing the organic photomultiplication photodetector of Embodiment 1. The information of the materials used herein is listed as follows:

Poly(3-hexylthiophene-2,5-diyl)(P3HT), 40±1 mg; [6,6]-phenyl-$C_{70}$-butyric acid methyl ester($PC_{70}$BM), 40±1 mg; poly(3,4-ethylenedioxythiophene)-poly(styrenesulfonate) (PEDOT:PSS), 1 mL; 1,2-dichlorobenzene (o-DCB), 2 mL; trimethylaluminium (Al($CH_3$)$_3$), 20±10 mL; water ($H_2O$), 20±10 mL; cleaner (containing surfactant, calcium carbonate, organic acid and essence; Guangzhou Jieerliang Commodity Co., Ltd.), 1±0.5 mL; detergent (containing softened water, surfactant, vitamin E ester and lemon extract; Guangzhou Liby Enterprise Group Co., Ltd.), 1±0.5 mL; deionized water, 8000±50 mL; acetone, 250±5 mL; isopropanol; ethanol, 250±5 mL; and conductive glass substrate (indium tin oxide, ITO), 19 mm×19 mm×1 mm.

The organic photomultiplication photodetector prepared herein has a 5-layer structure, which is composed of the anode layer, the anode modification layer, the interfacial modification layer, the active layer and the cathode layer. The anode layer is an ITO transparent electrode, which is prepared on a glass substrate as a substrate layer. The anode modification layer (i.e., the PEDOT:PSS layer) is coated on the anode layer. The interfacial modification layer (i.e., the $Al_2O_3$ layer) is deposited on the anode modification layer. The active layer (i.e., the P3HT:$PC_{70}$BM layer) is coated on the $Al_2O_3$ interfacial modification layer. The cathode layer (i.e., a layer of aluminum, silver or gold) is arranged on the active layer.

Chemical materials and reagents with appropriate quality, purity, concentration, fineness, and precision are selected, which are listed as follows:

P3HT: solid powder; molecular weight: 30,000 to 65,000;
$PC_{70}$BM: solid powder; particle size: ≤28 μm; purity: 99.99%;
PEDOT:PSS: liquid; solid content: 1.0-1.3%; mass ratio of PEDOT to PSS is 1:2.5; resistance: 500-5000 Ω/cm;
deionized water: liquid; purity 99.99%;
acetone: liquid; purity 99.5%;
ethanol: liquid, purity 99.99%;
conductive glass substrate (indium tin oxide, ITO): solid; transmittance: about 86%; surface roughness $R_a$: 0.16-0.32 nm; square resistance: 10 Ω/$cm^2$;
aluminum, silver and gold: solid powder; particle size: ≤28 μm; purity 99.99%.

The manufacturing method of the organic photomultiplication photodetector is specifically described as follows.

(S1) A solution of the active layer is prepared through the following steps.

(1) 40 mg of P3HT and 40 mg of $PC_{70}$BM are respectively placed into two 5 mL brown bottles.

(2) The two brown bottles are respectively added with 1 mL of 1,2-dichlorobenzene (o-DCB).

(3) The two brown bottles are placed on a magnetic stirrer and stirred at 60° C. for at least 12 h to allow the P3HT and $PC_{70}BM$ to be completely dissolved to obtain a P3HT solution and a $PC_{70}BM$ solution.

(4) 10 μL of the $PC_{70}BM$ solution and 1 mL of the P3HT solution are mixed uniformly under stirring at 60° C. to obtain the solution of the active layer, in which a weight ratio of P3HT to $PC_{70}BM$ is 100:1.

(S2) An ITO glass substrate is cleaned and processed with a plasma cleaner to be used as the anode layer 1, and a PEDOT:PSS layer is applied to the anode layer by spin-coating as the anode modification layer 2.

The cleaning and processing of the ITO glass substrate are performed as follows.

(1) The ITO glass substrate is ultrasonically cleaned in a mixed solution of the cleaner (Guangzhou Jieerliang Commodity Co., Ltd.) and the detergent (Guangzhou Liby Enterprise Group Co., Ltd.) for an hour.

(2) The front and back surfaces of the ITO glass substrate are lightly rubbed by hands on which a pair of disposable gloves is worn until a water film can be formed on the surfaces under rinsing with the deionized water.

(3) The ITO glass substrate is ultrasonically cleaned in deionized water in an ultrasonic cleaner for 15 minutes;

(4) The ITO glass substrate is ultrasonically cleaned in acetone for 15 minutes.

(5) The ITO glass substrate is ultrasonically cleaned in isopropanol for 15 minutes.

(6) The cleaned ITO glass substrate is cleaned in a plasma cleaner by ozone cleaning for 5 minutes.

The spin-coating of the PEDOT:PSS layer to be used as the anode modification layer is performed as follows.

(1) 100 μL of PEDOT:PSS is dripped on the surface of the ITO glass substrate, and spin-coated for 30 seconds at a rotation speed of 5000 rpm.

(2) the ITO glass substrate coated with the PEDOT:PSS layer is placed on a heating table, annealed at 120° C. for 15 minutes, and subjected to standing at room temperature for at least 5 minutes.

(S3) The deposition of $Al_2O_3$ on the anode modification layer 2 by atomic layer deposition to obtain an $Al_2O_3$ film as the interfacial modification layer 3.

The deposition of the interfacial modification layer 3 is performed as follows. (1) The containers respectively containing trimethyl aluminum ($Al(CH_3)_3$) and water ($H_2O$) are separately installed on the corresponding positions of the atomic layer deposition (ALD) system, and a temperature in the chamber is set to 150° C.

(2) The substrate spin-coated with PEDOT:PSS is removed to the chamber of the atomic layer deposition (ALD) system. With the chamber vacuumized, the $Al_2O_3$ is deposited on the anode modification layer as the interfacial modification layer with a thickness of 0.8 nm, in which the $Al_2O_3$ is deposited at a rate of 0.1 nm/one cycle and the number of cycles is 8.

(S4) A P3HT:$PC_{70}BM$ layer is applied on the interfacial modification layer 3 by spin-coating as the active layer 4.

The spin coating of the active layer 4 is performed as follows.

(1) The substrate deposited with the interfacial modification layer 3 is transferred to a glove box. After standing for at least 5 minutes, 25 μL of P3HT:$PC_{70}BM$ mixed solution is taken and dripped on the surface deposited with the $Al_2O_3$ interfacial modification layer, followed by spin-coating for 30 seconds at a rotation speed of 1200 rpm.

(2) The substrate spin-coated with P3HT:$PC_{70}BM$ is placed on the heating table, annealed at 80° C. for 20 seconds and subjected to standing for 15 minutes in vacuum, then the substrate is placed in a vacuum thermal evaporation chamber.

(S5) A layer of aluminum, silver or gold s applied on the active layer by thermal evaporation as the cathode layer 5.

The preparation in the vacuum thermal evaporation chamber is performed as follows.

(1) The vacuum thermal evaporation chamber is opened, and the substrate spin-coated with P3HT:$PC_{70}BM$ is fixed on a rotating table at the top of the chamber with the surface coated with P3HT:$PC_{70}BM$ facing downward.

(2) The material for evaporation including particles of aluminum, silver or gold is placed in the evaporation container, a tungsten boat by weight.

(3) A quartz probe for measuring thickness and a quartz probe for monitoring on the wall of the furnace are adjusted, so that the quartz probe for measuring thickness is aligned with the substrate on the rotating table, and the quartz probe for monitoring is aligned with the layer of aluminum, silver or gold.

(4) A door of the vacuum thermal evaporation chamber is closed and sealed.

(5) A mechanical vacuum pump, and a molecular vacuum pump are turned on to extract the air out of the chamber, so that the vacuum degree is less than or equal to 0.0005 Pa in the chamber, and is kept constantly.

(6) The rotating table is turned on to drive the ITO glass substrate to rotate at a rotation speed of 5 r/min.

(7) The quartz probe for measuring thickness is turned on;

(8) The cathode of aluminum, silver or gold is evaporated. A power supply of the tungsten boat containing aluminum, silver or gold is turned on to sublime the aluminum, silver or gold from a solid to a gaseous state, such that the gaseous molecules are deposited and grown on the active layer 4 to form a flat film layer. The controlling button of the power supply of the tungsten boat is adjusted to increase a power, such that the growth rate of the film is maintained at 0.1 nm/s, and the thickness of the film is 100±20 nm. During the preparation, the quartz probe for measuring thickness measures a thickness of the evaporation, and displays the value of the thickness on the display screen. The process and status of the evaporation is observed through a middle observing window. The material for evaporation is sublimated and changed in state by heating, and deposited on the substrate spin coated with P3HT:$PC_{70}BM$ by vapor deposition, to form a flat film.

(9) After the evaporation of the film, the organic photomultiplication photodetector is subjected to standing and cooling in a vacuum chamber for 10 minutes.

(10) The molecular vacuum pump and the mechanical vacuum pump are turned off, an air inlet valve is switched on, and the door of vapor deposition is opened, such that the substrate of the organic photomultiplication photodetector, which is the organic photomultiplication photodetector containing an $Al_2O_3$ ultra-thin interfacial modification layer as a product is collected as a product.

In this embodiment, the performance of the organic polymer photomultiplication photodetector prepared is tested, analyzed, and characterized. A digital source meter (2400, Keithley) is utilized to measure the current density-voltage characteristic curve of the device. A monochromator/spectrography (Omni-λ, 300, Zolix) and a camera obscura are utilized to measure the external quantum efficiency (EQE) and the responsivity (R) of the organic polymeric photomultiplication photodetector, so as to compare and analyze the performance of the prepared devices with or without the ultra-thin $Al_2O_3$ interfacial modification layer.

Figure 2:
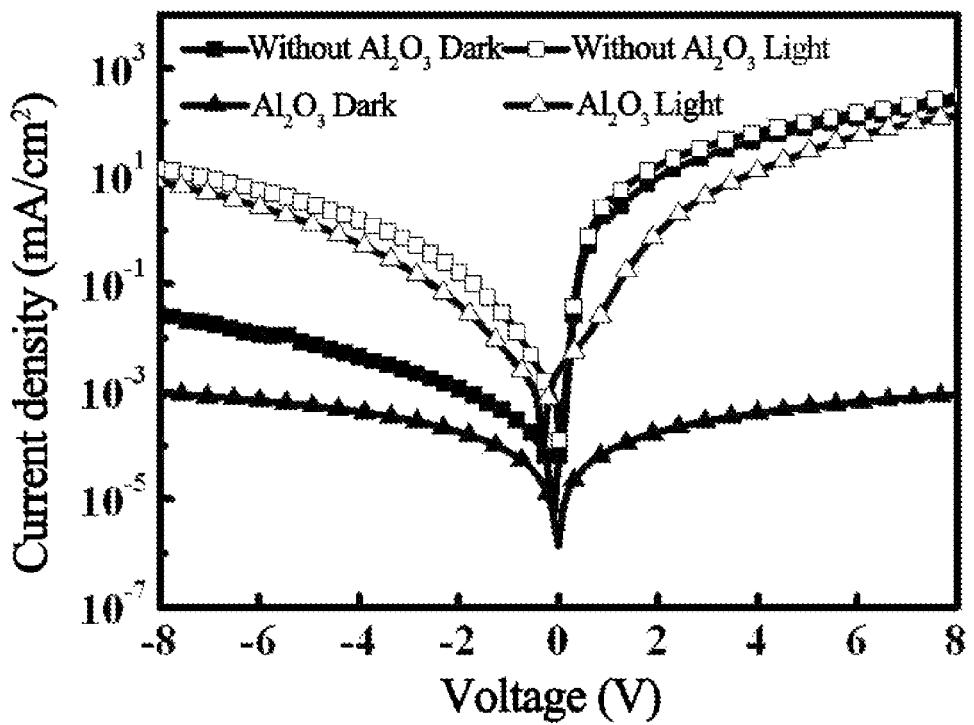
FIG. 2 illustrates a current density-voltage characteristic curves of the organic photomultiplication photodetector under dark and light according to an embodiment of this application.

In conclusion, the organic photomultiplication photodetector without the $Al_2O_3$ interfacial modification layer is set as a control device. From the current density-voltage characteristic curves under the dark and light in FIG. 2, it illustrates that the organic photomultiplication photodetector introduced with the $Al_2O_3$ interfacial modification layer has an obvious light to dark current ratio under each condition of a forward bias and a reverse bias, compared with the control device. By introducing the $Al_2O_3$ interfacial modification layer, the organic photomultiplication photodetector achieves the transition of from generating response under a unidirectional bias to generating response under a bi-directional bias response.

Figure 3:
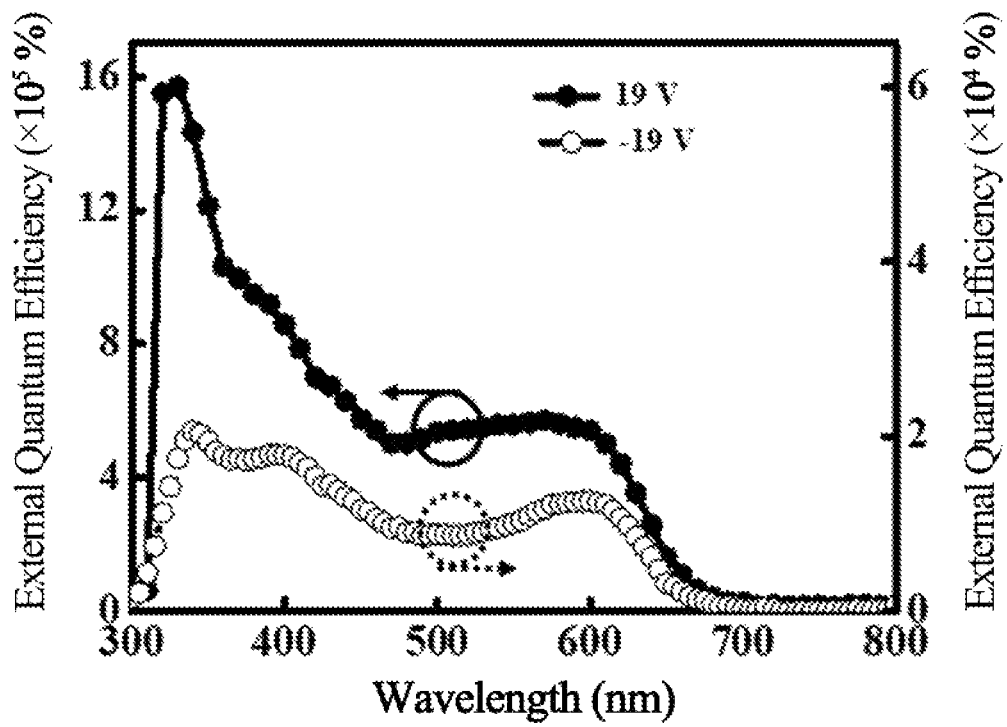
FIG. 3 shows an external quantum efficiency curve of the organic photomultiplication photodetector according to an embodiment of this application.
Figure 4:
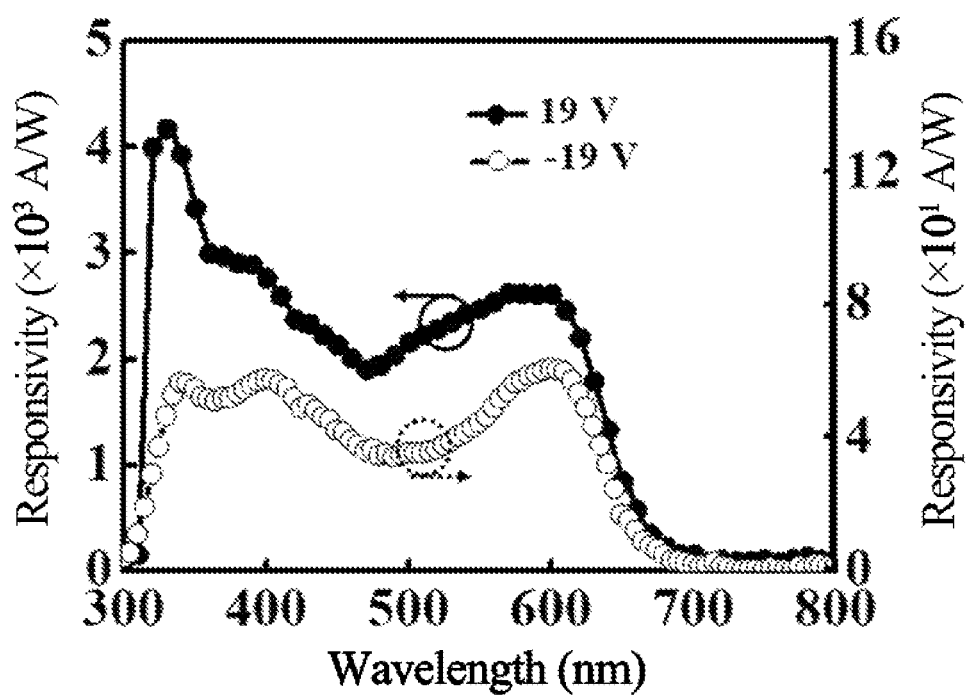
FIG. 4 shows a responsivity curve of the organic photomultiplication photodetector according to an embodiment of this application.

In addition, as shown in FIGS. 3 and 4, the external quantum efficiency (EQE) and the responsivity (R) of the organic photomultiplication photodetector introduced with the $Al_2O_3$ interfacial modification layer varying with the wavelength is analyzed, under each condition of the forward bias and the reverse bias in light. From the FIGs, the organic photomultiplication photodetector introduced with the $Al_2O_3$ interfacial modification layer has high external quantum efficiency (EQE) and responsivity (R) under the forward bias and the reverse bias. The organic photomultiplication photodetector exhibits an external quantum efficiency of $1.75 \times 10^4$% and a responsivity of 46.44 A/W under a bias of $-19$ V and a wavelength of 330 nm, and an external quantum efficiency of $1.57 \times 10^6$% and a responsivity of 4169.49 A/W under a bias of 19 V and a wavelength of 330 nm. It can be concluded that the organic photomultiplication photodetector introduced with the $Al_2O_3$ interfacial modification layer provided herein shows higher external quantum efficiency (EQE) and responsivity (R) under the forward bias compared to the reverse bias. This is mainly due to that the organic photomultiplication photodetector introduced with the $Al_2O_3$ interfacial modification layer provided herein has higher light current, leading to that more photogenerated electrons are trapped in the interface of the anode layer, which facilitates hole tunneling injection from the external circuit, and improves the external quantum efficiency (EQE) and the responsivity (R) of the device.

In summary, this application provides an organic photomultiplication photodetector with bi-directional bias response and a method for producing the same, which introduces the ultra-thin $Al_2O_3$ interfacial modification layer into the structure of the device for the organic photomultiplication photodetector as the interfacial modification layer. It overcomes the defect that the relatively thick interfacial modification layer or anode modification layer is introduced into the traditional devices to achieve generating response under bi-directional bias, and achieves the organic photomultiplication photodetector with bi-directional bias response, which widens the extent of application of the device. In addition, the atomic layer deposition (ALD) method is used to deposit $Al_2O_3$ on the anode modification layer to be obtained as the ultra-thin interfacial modification layer, and can accurately control the thickness of $Al_2O_3$. The method is of simplicity, convenience and low in cost, and can acquire high external quantum efficiency (EQE) and responsivity (R) of the organic photomultiplication photodetector with bi-directional bias response which is potential in application.

Finally, it should be noted that the embodiments described above are only used to illustrate the technical solutions of this application, but not intended to limit the application. Although the application is described in detail with reference to the above-mentioned embodiments, it should be understood that any modifications, replacements and variations made by those of ordinary skill in the art without departing from the spirit of the application should fall within the scope of the application defined by the appended claims.

What is claimed is:

1. A method for preparing an organic photomultiplication photodetector, the organic photomultiplication photodetector comprising:
   an anode layer;
   an anode modification layer;
   an interfacial modification layer made of aluminum oxide ($Al_2O_3$);
   an active layer; and
   a cathode layer;
   the method comprising:
   (S1) preparing a solution of the active layer;
   (S2) cleaning an indium tin oxide (ITO) glass substrate followed by processing with a plasma cleaner to be used as the anode layer; and applying a poly(3,4-ethylenedioxythiophene):poly(styrenesulfonate) (PEDOT:PSS) layer on the anode layer by spin-coating as the anode modification layer;
   (S3) depositing $Al_2O_3$ on the anode modification layer by atomic layer deposition (ALD) to obtain an $Al_2O_3$ film as the interfacial modification layer;
   (S4) applying a poly(3-hexylthiophene-2,5-diyl):[6,6]-phenyl-$C_{70}$-butyric acid methyl ester (P3HT:$PC_{70}BM$) layer on the interfacial modification layer by spin coating as the active layer; and
   (S5) depositing a layer of aluminum, silver or gold on the active layer by thermal evaporation as the cathode layer.

2. The method of claim 1, wherein in step (S1), the solution of the active layer is prepared through steps of:
   respectively dissolving 40 mg of poly(3-hexylthiophene-2,5-diyl) (P3HT) and 40 mg of [6,6]-phenyl-$C_{70}$-butyric acid methyl ester ($PC_{70}BM$) in 1 mL of 1,2-dichlorobenzene (o-DCB) followed by stirring at 60° C. to produce a P3HT solution and a $PC_{70}BM$ solution; and mixing a 0.01 mL of the $PC_{70}BM$ solution and 1 mL of the P3HT solution followed by stirring at 60° C. to obtain the solution of the active layer, wherein a weight ratio of P3HT to $PC_{70}BM$ is 100:1.

3. The method of claim 1, wherein in step (S2), after the PEDOT:PSS layer is spin-coated on the ITO glass substrate, the ITO glass substrate coated with the PEDOT:PSS layer is placed on a heating table, annealed at 120° C. for 15 minutes, and subjected to standing at room temperature for at least 5 minutes before proceeding to step (S3).

4. The method of claim 1, wherein in step (S3), the interfacial modification layer is prepared through steps of:
   reacting trimethylaluminum with water vapor at 150° C. to produce $Al_2O_3$; and depositing the $Al_2O_3$ on the anode modification layer followed by vacuum standing for at least 5 minutes;
   wherein the $Al_2O_3$ is deposited at a rate of 0.1 nm/one cycle, and the number of cycles is controlled to determine a thickness of the $Al_2O_3$ film.

5. The method of claim 1, wherein the step of applying a P3HT:$PC_{70}BM$ layer on the interfacial modification layer by spin-coating as the active layer comprises:
   applying the solution of the active layer on the interfacial modification layer by spin coating at a rotation speed of 1200 rpm followed by annealing at 80° C. for 20 seconds and standing in a glove box for at least 3 minutes.

* * * * *